(12) United States Patent
Kwon

(10) Patent No.: US 6,311,304 B1
(45) Date of Patent: Oct. 30, 2001

(54) METHOD FOR ENCODING/DECODING DIGITAL DATA BY USING SHUFFLING IN DIGITAL VIDEO HOME SYSTEM

(75) Inventor: Bong-Hyen Kwon, Seoul (KR)

(73) Assignee: Daewoo Electronics Co., Ltd., Seoul (KR)

( * ) Notice: Subject to any disclaimer, the term of this patent is extended or adjusted under 35 U.S.C. 154(b) by 0 days.

(21) Appl. No.: 09/222,922

(22) Filed: Dec. 30, 1998

(30) Foreign Application Priority Data

Dec. 30, 1997 (KR) .............................................. P 97-78836

(51) Int. Cl.[7] .......................... H03M 13/00; G06F 11/00
(52) U.S. Cl. ..................... 714/755; 714/701; 714/761; 714/762
(58) Field of Search ................................... 714/756, 701, 714/762, 755

(56) References Cited

U.S. PATENT DOCUMENTS

| | | | |
|---|---|---|---|
| 3,652,998 | * 3/1972 | Forney, Jr. ............................ | 377/64 |
| 5,289,322 | * 2/1994 | Higashida et al. .................... | 386/124 |
| 5,392,299 | * 2/1995 | Rhines et al. ......................... | 714/756 |
| 5,928,371 | * 7/1999 | Robinson, Jr. et al. .............. | 714/702 |
| 6,112,324 | * 8/2000 | Howe et al. .......................... | 714/763 |
| 6,122,764 | * 9/2000 | Kobayashi ............................ | 714/758 |

\* cited by examiner

Primary Examiner—Albert Decady
Assistant Examiner—Joseph Torres
(74) Attorney, Agent, or Firm—Pillsbury Winthrop LLP

(57) ABSTRACT

A method for error correction coding (ECC) by using shuffling of a digital data supplied as a bit stream in a digital-video home system. Three methods are suggested for error correction coding/decoding. One method is where an outer ECC process for 18 ECC blocks is performed earlier than an inner ECC process for the 18 ECC blocks. Another method is where an outer ECC process and an inner ECC process for an ECC block are carried out sequentially and implemented in order for 18 ECC blocks. These two methods employ a predetermined shuffling algorithm. The third method is where an outer ECC process is firstly performed for 18 ECC blocks by using the shuffling algorithm, and then an inner ECC process is implemented by the sync block according to a recording order on tracks. The outer parity information is produced by processing the data from the shuffled sync block.

6 Claims, 7 Drawing Sheets

FIG. 6

| VALUE OF 's' | 0~111 | 0~111 | 0~111 | 0~111 | 0~111 | 0~111 | 0~111 | 0~111 | 0~111 | 0~111 | 0~111 | 0~111 | 0~111 | 0~111 | 0~111 | 0~111 | 0~111 | 0~111 |
|---|---|---|---|---|---|---|---|---|---|---|---|---|---|---|---|---|---|---|
| VALUE OF 'g' | 0 | 1 | 2 | 0 | 1 | 2 | 0 | 1 | 2 | 0 | 1 | 2 | 0 | 1 | 2 | 0 | 1 | 2 |
| VALUE OF 't' | 0 | | | 1 | | | 2 | | | 3 | | | 4 | | | 5 | | |
| ECC BLOCK NO. | 0 | 1 | 2 | 3 | 4 | 5 | 6 | 7 | 8 | 9 | 10 | 11 | 12 | 13 | 14 | 15 | 16 | 17 |

FIG. 8

| VALUE OF 'HSB' | VALUE OF 'g' | VALUE OF 't' | ECC BLOCK NO. |
|---|---|---|---|
| 0 ~ 106 | 0 | 0 | 0 |
| 0 ~ 106 | 1 |   | 1 |
| 0 ~ 106 | 2 |   | 2 |
| 0 ~ 106 | 0 | 1 | 3 |
| 0 ~ 106 | 1 |   | 4 |
| 0 ~ 106 | 2 |   | 5 |
| 0 ~ 106 | 0 | 2 | 6 |
| 0 ~ 106 | 1 |   | 7 |
| 0 ~ 106 | 2 |   | 8 |
| 0 ~ 106 | 0 | 3 | 9 |
| 0 ~ 106 | 1 |   | 10 |
| 0 ~ 106 | 2 |   | 11 |
| 0 ~ 106 | 0 | 4 | 12 |
| 0 ~ 106 | 1 |   | 13 |
| 0 ~ 106 | 2 |   | 14 |
| 0 ~ 106 | 0 | 5 | 15 |
| 0 ~ 106 | 1 |   | 16 |
| 0 ~ 106 | 2 |   | 17 | ns
METHOD FOR ENCODING/DECODING DIGITAL DATA BY USING SHUFFLING IN DIGITAL VIDEO HOME SYSTEM

BACKGROUND OF THE INVENTION

1. Field of the Invention

The present invention relates to a method for encoding/decoding of digital data, and more particularly to a method, in a digital-video home system (D-VHS), for the encoding/decoding of digital data by utilizing data shuffling.

2. Description of the Prior Art

In a magnetic and optic recording system such as a digital phone, a digital video cassette recorder and a digital compact disc, scratches or fine dust results in frequent occurrences of burst errors having a long error length or partially concentrated errors.

In a system having a high possibility for burst error, a Reed-Solomon (RS) coding method has been widely used and recognized as a powerful error correcting code. According to this coding method, before transmission or recording of digital data, outer parity information and inner parity information generated by an RS coder are added to the digital data. The added outer parity information and inner parity information effectively serve as a powerful tool to correct errors occurring during transmission or recording of digital data upon receipt of data or upon reproduction of data by an RS decoder.

Data shuffling has also been used to provide more powerful error correction. Generally, shuffling means a method of scrambling digital data in a time axis upon recording the digital data onto a recording material such as a magnetic tape. As a prior art relating to a shuffling of digital data, U.S. Pat. No. 5,301,018, entitled 'METHOD AND APPARATUS FOR SHUFFLING IMAGE DATA INTO STATISTICALLY AVERAGED DATA GROUPS AND FOR RESHUFFLING THE DATA', issued to Peter Smith and two other inventors, was disclosed. In accordance with this art, to equalize the information content of the data prior to compression, the video image is divided into a plurality of image representing blocks and a predetermined number of the image blocks from different spatial locations in the image to form a succession of data sets representative of the video image information. There are various prior arts relating to data shuffling, including U.S. Pat. No. 5,321,748, entitled 'METHOD AND APPARATUS FOR TELEVISION SIGNAL SCRAMBLING USING BLOCK SHUFFLING', issued to David E. Zeidler and John T. Griffin.

However, these prior arts do not disclose a coding technique based on the D-VHS. The D-VHS is a new digital data recording art based on a video home format where compressed information such as digital broadcasting data can be recorded. A technical specification of the D-VHS was mainly prepared by the JVC company of Japan in 1995. The D-VHS is a bit stream recording/reproducing apparatus where compressed or processed digital data is recorded directly in a tape without additional processing of data and is reproduced from the tape. A bit stream recording unit does not integrate functions of analog/digital conversion, digital/analog conversion, digital compression/decompression, or descrambling.

Consequently, to accomplish a purpose of improving an error correcting ability in the D-VHS, a new data coding/decoding method is required. For this, a method employing data shuffling during producing of inner parity information and outer parity information by the RS coding can be considered. In other words, the shuffling and the RS coding are coupled during a recording of digital data onto a magnetic tape, so that the method creates parity information for error correction corresponding to a predetermined size of data read in a scrambled time order from a memory in which the data are sequentially stored, and stores the parity information so as to be related with the data before being recorded onto the magnetic tape. The method of data shuffling distributes burst errors, so that error correction becomes easy.

SUMMARY OF THE INVENTION

Therefore, the present invention is invented to solve the above problems of the prior arts, and an object of the present invention is to provide a method for error correction coding and decoding that, upon encoding and decoding digital data in the D-VHS, shuffles sync blocks based on RS codes after calculating a track number and a sync block number by using a predetermined shuffling algorithm.

To accomplish the object, a digital data supplied as a bit stream into the D-VHS is encoded by a method that comprises the steps of:

(A) adding outer parity information to a main data of the digital data by: i) storing the main data constituting a frame to which a track number and a sync block number are designated in a storing means, wherein the frame includes 18 ECC blocks and each ECC block includes 102 sync blocks; ii) setting values of parameters t, g, s and VSB as 0, wherein the parameters t, g, s, and VSB respectively represent a number for tracks constituting the frame, a number for logical ECC blocks belonging to a track, a number for bytes of data constituting a vertical sync block within the ECC block, and a number for the vertical sync blocks constituting a ECC block; iii) calculating a track number TR and a sync block number SB by using equation (1), which is TR=[t+(s×5)] mod 6 and SB=g+s×3, while increasing a value of the parameter s by 1 from 0 to 101 and forming a vertical sync block by shuffle-reading by the byte the main data from a sync block which corresponds to the calculated track number TR and sync block number SB; iv) producing a predetermined byte of the outer parity information for error correction by using a predetermined polynomial with respect to the vertical sync block, and shuffle-writing by the byte the outer parity information at a location of the track number TR and the sync block number SB, which are calculated from the equation (1), in the storing means, while increasing a value of the parameter s by 1 from 102 to 111; v) performing recursively substeps iii) and iv) while increasing a value of the parameter VSB by 1 from 0 to 98 and resetting the parameter s as 0 at every increment; vi) performing recursively steps iii), iv) and v) while increasing a value of the parameter g by 1 from 0 to 2 and resetting the parameters s and VSB as 0 at every increment; and vii) performing recursively the substeps iii), iv), v) and vi) while increasing a value of the parameter t by 1 from 0 to 5 and resetting the parameters s, VSB and g as 0 at every increment, wherein the outer parity information with respect to the main data of one frame is produced by shuffling through substeps i) to vii), and the produced outer parity information is written in the storing means by shuffling; and (B) adding inner parity information to the main data and the outer parity information of the digital data by: a)

setting values of parameters t, g, P, and HSB as 0, wherein the parameters P and HSB respectively represent a number for bytes of a sync block of the main data and the outer parity information and a number for horizontal sync blocks belonging to the ECC block of the main data and the outer parity information; b) calculating a track number TR and a sync block number SB by using equation (2), which is TR=[t+(HSB×5)] mod 6 and SB=g+HSB×3, while increasing a value of the parameter P by 1 from 0 to 98 and forming a horizontal sync block by reading by the byte the main data and the outer parity information from a sync block which corresponds to the calculated track number TR and sync block number SB; c) producing a predetermined byte of the inner parity information for error correction of the horizontal sync block by using a predetermined polynomial, and writing the outer parity information by the byte at a location of the track number TR and the sync block number SB, which are calculated from equation (2), in the storing means, while increasing a value of the parameter P by 1 from 99 to 106; d) performing recursively substeps b) and c) while increasing a value of the parameter HSB by 1 from 0 to 111 and resetting the parameter P as 0 at every increment; e) performing recursively substeps b), c) and d) while increasing a value of the parameter g by 1 from 0 to 2 and resetting the parameters P and HSB as 0 at every increment; and f) performing recursively substeps b), c), d) and e) while increasing a value of the parameter t by 1 from 0 to 5 and resetting the parameters P, HSB and g as 0 at every increment, wherein the inner parity information with respect to the frame of the main data and the outer parity information is produced through substeps a) to f), and the produced inner parity information is written in the storing means.

The data encoded by the above method recorded on a recording medium is decoded by performing a step of decoding for error correction by using the outer parity information and the inner parity information after reading out encoded data from the recording medium and storing the encoded data in the storing means, wherein an error correction decoding using the inner parity information is firstly performed for the 18 ECC blocks, an error correction decoding using the outer parity information of the 18 ECC blocks is secondly performed, a data processing order for the error correction decoding by using the inner parity information is the same as a data processing order for producing of the inner parity information, and a data processing order for the error correction decoding by using the outer parity information is the same as a data processing order for producing the outer parity information.

According to the present invention for producing and storing of outer parity information and inner parity information for digital data in the D-VHS, the error correction capability can be increased in reproducing of the recorded data even in the case of burst errors.

BRIEF DESCRIPTION OF THE DRAWINGS

The above object and other advantages of the present invention will become more apparent by describing in detail preferred embodiments thereof with reference to the attached drawings, in which:

FIG. 6 is a table listed by parameters to clarify the process of outer ECC in FIG. 5;

FIG. 8 is a table listed by parameters to clarify the process of inner ECC in FIG. 7.

DETAIL DESCRIPTION OF THE INVENTION

Hereinafter, a preferred embodiment of the present invention will be explained in more detail with reference to the accompanying drawings.

Figure 1:
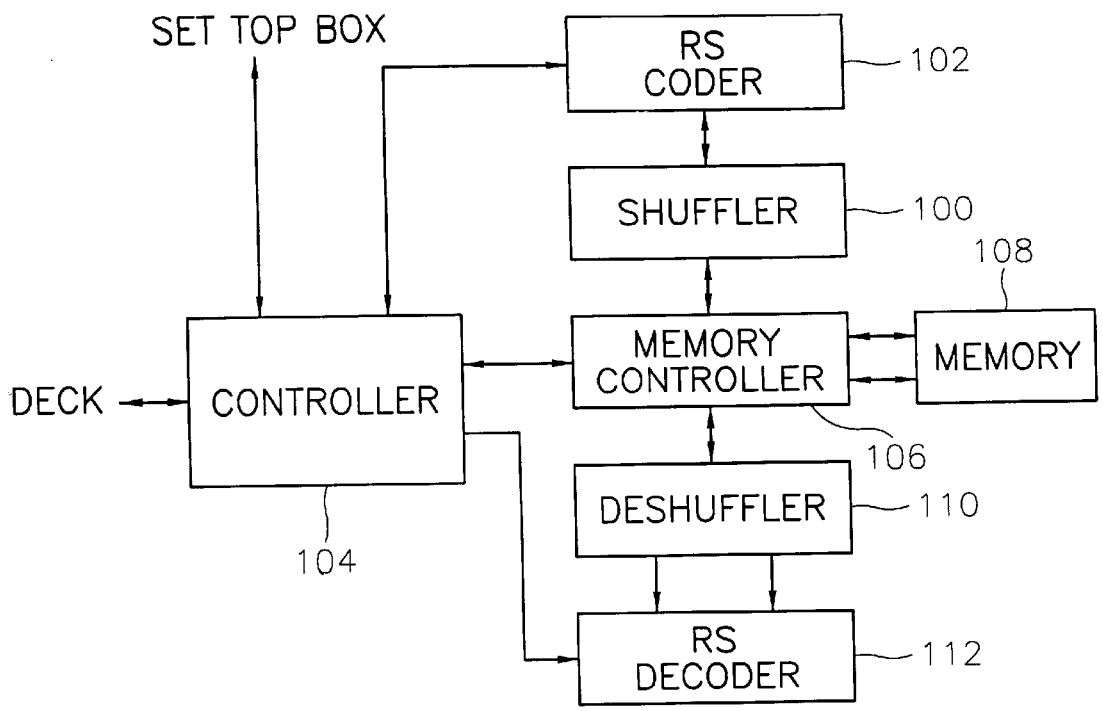
FIG. 1 is a block diagram of an apparatus for performing a method for coding/decoding digital data by using data shuffling according to the present invention.

The present invention is a method for implementing RS coding and RS decoding of received digital main data based on a data shuffling. A part circuit of a coder-decoder (CODEC) in the D-VHS which performs the method is shown in FIG. 1. This apparatus includes a controller 104, an RS coder 102, a shuffler 100, a memory controller 106, a memory 108, a deshuffler 110 and an RS decoder 112.

To perform RS coding by using shuffling, two data processes of outer ECC and inner ECC, are carried out. One encoding method in which inner parity information is produced and used for intra-sync block error correction is called inner ECC, and the other encoding method in which outer parity information is produced and used for inter-track error correction is called outer ECC.

In the present encoding method, various combinations of the outer ECC and inner ECC processes are employed to encode main data of the D-VHS by the frame. At this time, a predetermined shuffling algorithm is applied.

Figure 2:
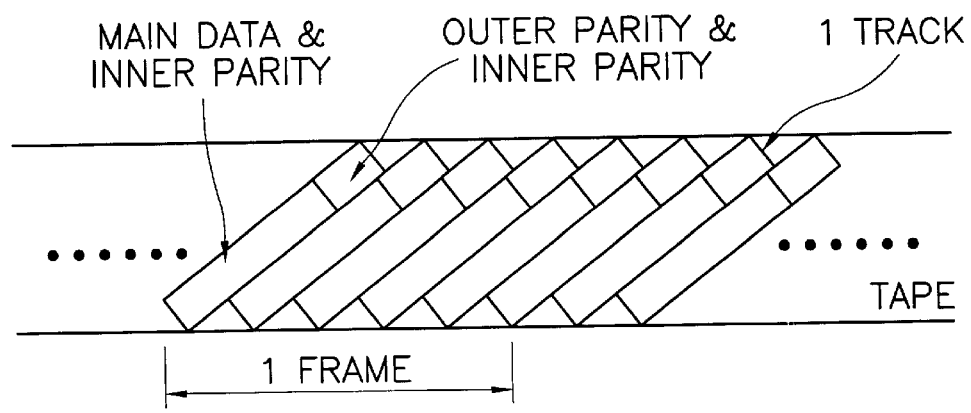
FIG. 2 is a schematic recording format of a tape having digital data coded by the present invention.
Figure 3:
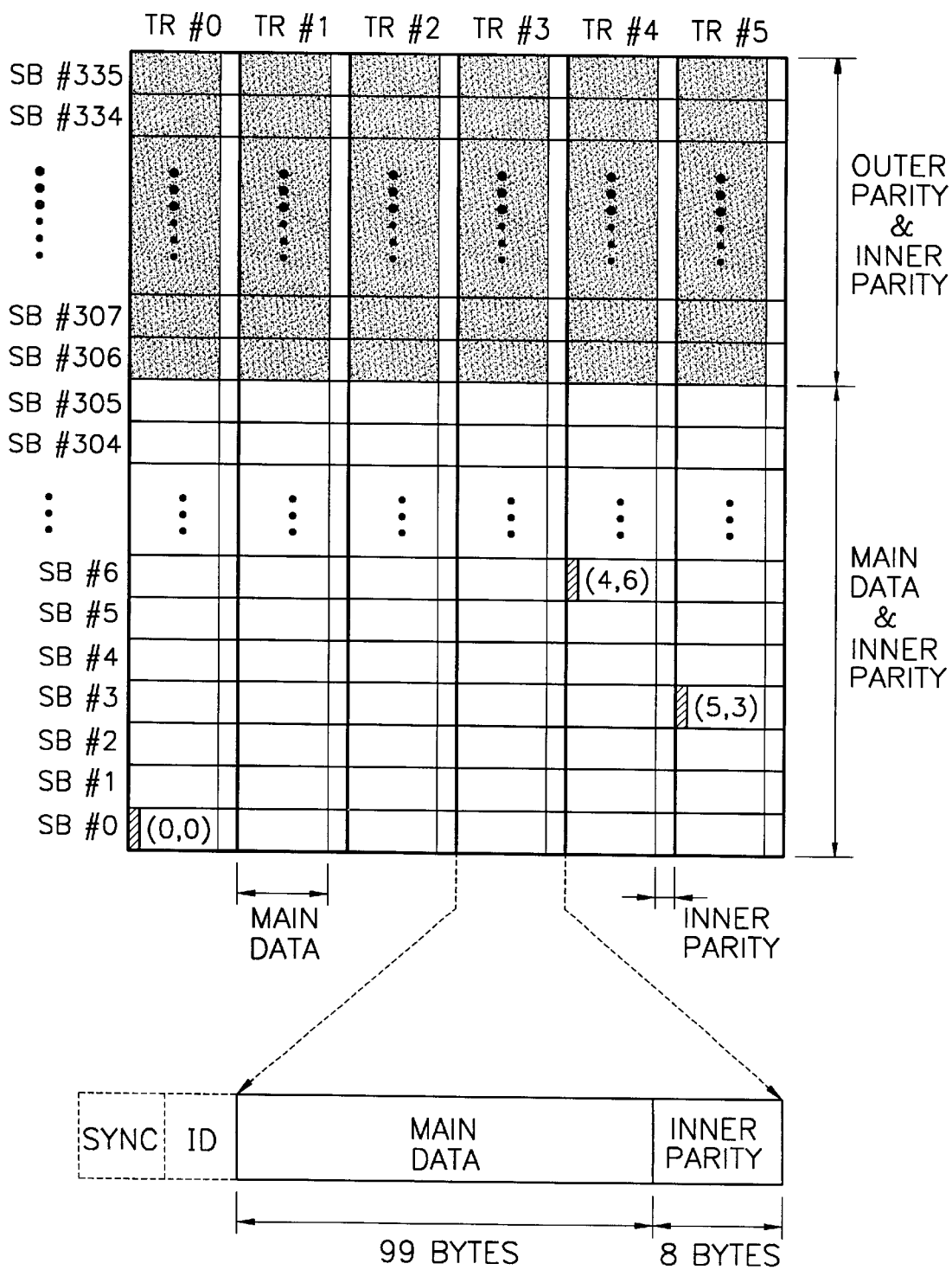
FIG. 3 shows a logical storage state of digital data in a memory coded by the present invention.

To initiate the encoding of the present invention, the main data, an object of encoding, is in advance stored in the memory 108. FIG. 3 shows a conceptual storage state of one main data frame in the memory 108 after the encoding process. Prior to this process, as shown in FIG. 3, the main data frame is designated with a track number and a sync block number by sync blocks, and is distributively arranged on six tracks of the memory 108. Each track consists of 306 main data sync blocks. After encoding the main data frame, 30 outer parity sync blocks are stored in an upper section of the six tracks in the memory 108, and inner parity information is added to each sync block of the main data and the outer parity information. The main data and the produced parity information, that is, codewords, are recorded on a magnetic tape in a format shown in FIG. 2 after a successive signal process.

Here, a more detailed description of this encoding process will be given. To be recorded on a tape, digital data are processed as follows. The main digital data transmitted from a broadcasting station through a satellite are tuned by a tuner (not shown) to select a wanted channel, and are provided to the controller 104 after a successive digital signal process. The controller 104 controls the memory controller 106 to provide a storage address and a memory control signal of a corresponding sync block data to the memory 108. By using an identification information of a sync block, the memory controller 106 calculates a memory address corresponding to the track number and the sync block number to store the sync block data in the memory 108. The controller 104 judges whether the sync block data of six tracks from track 0 to track 5 are completely stored in the memory 108 during these successive processes.

Figure 4:
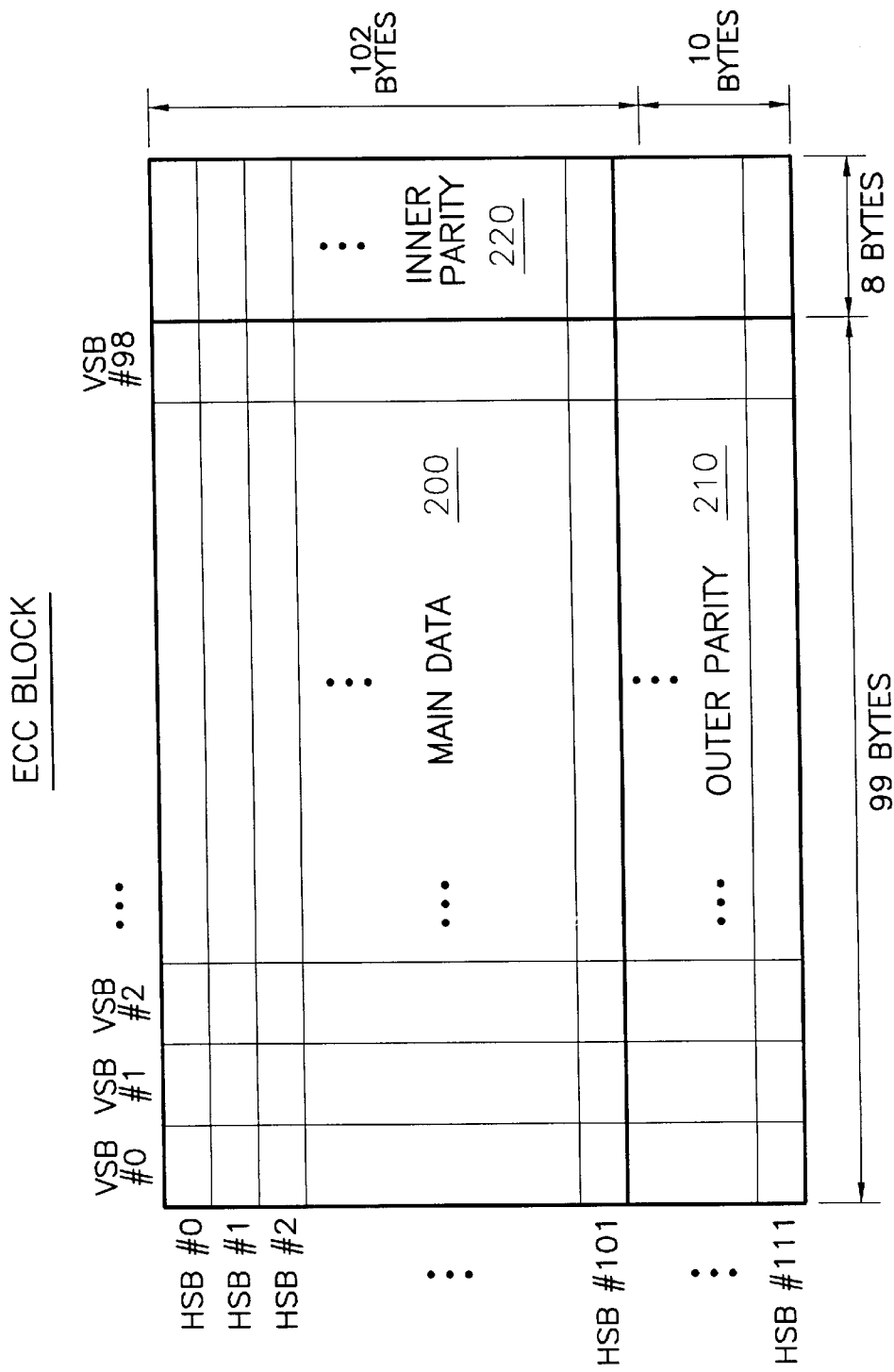
FIG. 4 shows a structure of an error correction coding block.

After acknowledging completion of a frame data storing process, the shuffler 100 is provided with sync blocks for outer ECC from the six stored tracks. FIG. 4 shows a structure of an ECC block including parity information. The shuffler 100 shuffles 1836 main data sync blocks of the six stored tracks (306 sync blocks/track) to form 18 first stage ECC blocks 200, each of which consists of 102 main data sync blocks.

Procedures for the outer ECC and the inner ECC concerning a frame of main data can be classified in the three following methods. The first is a method where the outer ECC with regard to 18 ECC blocks is performed earlier than the inner ECC with regard to the 18 ECC blocks obtained from the outer ECC. The second is a method where the outer ECC with regard to 18 ECC blocks is performed and then the inner ECC for all the sync blocks in 6 tracks is sequentially implemented. The third is a method where that the outer ECC and the inner ECC are sequentially carried out with regard to an ECC block and that is successively applied to 18 ECC blocks. Although a predetermined shuffling algorithm is employed by the inner ECC in the first and second ways, this inner ECC cannot be called genuine shuffling since genuine shuffling is utilized by the outer ECC.

First, an explanation about a coding method for error correction based on shuffling in accordance with the first method is given. A shuffling algorithm represented by the following equation (1) is used for the shuffling of sync blocks.

$$TR = [t + (s \times 5)] \bmod 6$$
$$SB = g + s \times 3 \quad (1)$$

where, the TR is a track number, the SB is a sync block number, the parameter t represents the number of tracks which constitute 1 frame and is an integer between 2 and 5, the parameter g represents the number of logical ECC blocks which are included in a track and is an integer between 0 and 2 since one ECC block contains 102 main data sync blocks and one track includes 306 main data sync blocks, the parameter s, on performing the outer ECC, represents the number of bytes which are included in a vertical sync block (VSB) of an ECC block and consequently is an integer between 0 and 101, and the mod means a modular operator where, for example, 'X mod 6' is a remainder whose value is 0, 1, 2, 3, 4 and 5, after dividing X by 6.

As shown in the enlargement in FIG. 3, one sync block includes 99 bytes of main data. Although the sync block further contains additional data such as 2 bytes of sync data and 3 bytes of ID data, except for the main data, these additional data are utilized as storing information of the main data, and only the main data are stored in the memory 108.

FIG. 4 illustrates an ECC block structure. The ECC block is called a product code and consists of a main data block 200, an inner parity block 220 and an outer parity block 210. The main data block 200 consists of 102 horizontal sync blocks (HSB) in a row and, as a horizontal sync block includes the 99 bytes of the main data, 99 vertical sync blocks (VSB) in a column. Consequently, the outer ECC is a process for inter-track RS coding in a row, and the inner ECC is a process for intra-sync block RS coding in a column.

Figure 5:
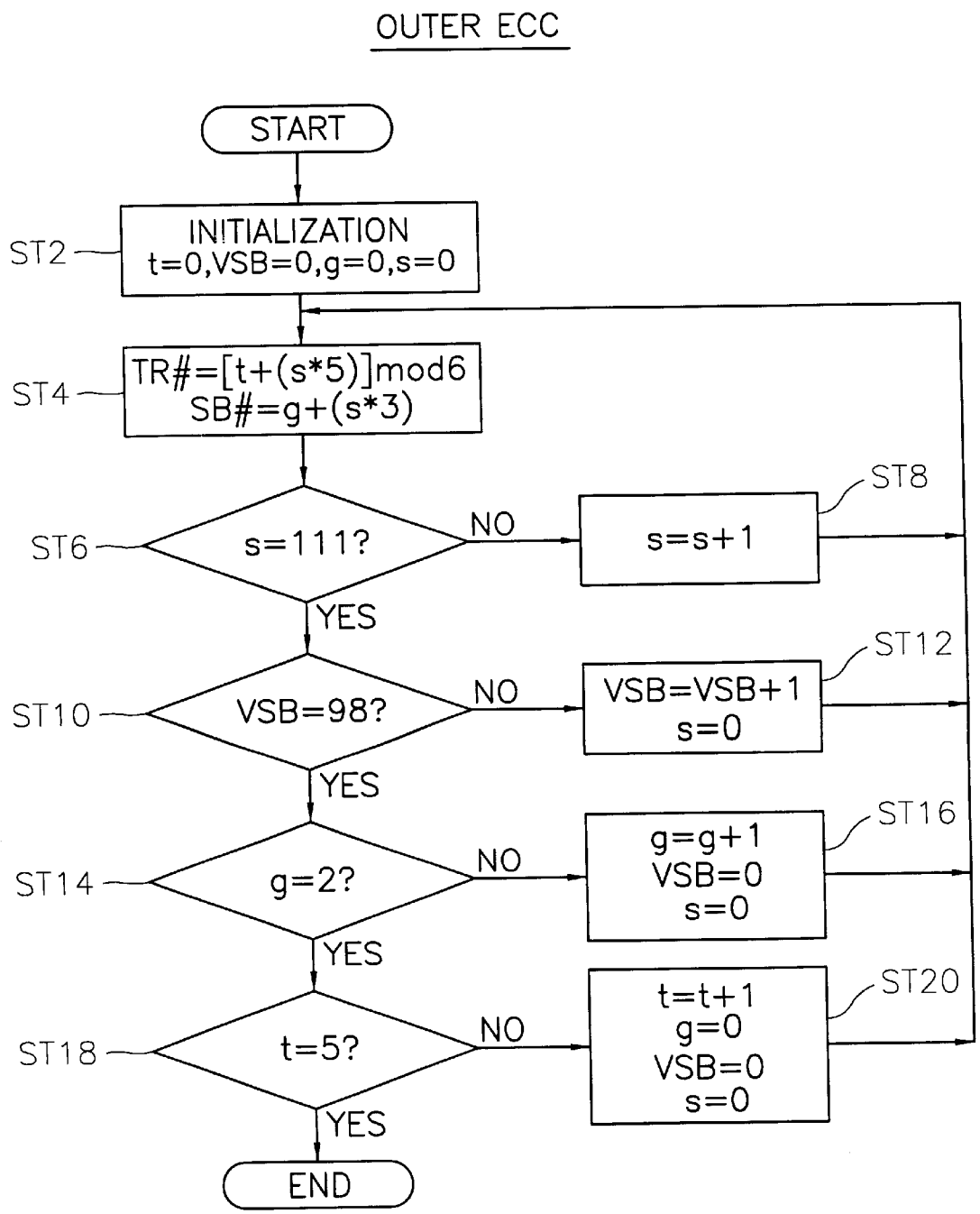
FIG. 5 is a flow chart for explaining a process of outer error correction coding (outer ECC) according to the present invention.

For the implementation of the outer ECC, a shuffling order of the main data sync block using equation (1) is shown in FIG. 5.

First, the parameters t, g, s and VSB representing numbers for the vertical sync blocks which are included in an ECC block are set as 0 for initialization (ST 2).

Continuously, while increasing the parameter s by 1 from 0 to 101 (ST 6, ST 8), the shuffler 100 calculates the track number TR and the sync block number SB by using equation (1) (ST 4). As the parameter s has the value from 0 to 102, coordinates of a track and a sync block (TR, SB) become (0, 0), (5, 3), (4, 6), . . . , (1, 303). The calculated track number TR and sync block number SB are utilized by the shuffler 100 upon shuffled reading the main data from the memory 108. That is, first bytes, which are shown as deviant lines in FIG. 3, are read from sync blocks whose coordinates of track and sync block (TR, SB) are (0, 0), (5, 3), (4, 6), . . . , (1, 303) in order to form a first vertical sync block VSB #0 which consists of 102 bytes of shuffled main data. The shuffled data are supplied to the RS coder 102 in order to perform the outer ECC and the inner ECC. The RS coder 102 produces 10 bytes of outer parity for error correction corresponding to the first vertical sync block VSB #0 by using a predetermined polynomial. Successively, while increasing the value of the parameter s from 102 to 111 by 1, the track number TR and the sync block number SB are calculated by using the equation (1), and the 10 byte outer parity is written by the byte to be shuffled in a position of the memory 108 corresponding to the calculated coordinates of the track and sync block (TR, SB)=(0, 306), (5, 309), . . . , (3, 333). Through the above process, production and storage of the outer parity of VSB #0, which is a leftmost column of the ECC block in FIG. 4, are completed.

Continuously, while increasing the value of parameter VSB by 1 from 0 to 98 and resetting the parameter s as 0, the steps ST 4, ST 6 and ST 8 are recursively performed (ST 10, ST 12). Whenever the parameter VSB increases by 1, the location of the byte to be shuffled from each main data sync block also increases by 1 byte, and whenever the value of the parameter VSB becomes 98, shuffling of all the main data included in one ECC block is finished. Consequently, completion of these above steps produces whole outer parity information of a first ECC block among 18 ECC blocks of 1 frame.

To perform outer ECC of the remaining 17 ECC blocks, the following steps ST 14, ST 16, ST 18 and ST 20 should be carried out. First, while increasing the value of the parameter g by 1 from 0 to 2 and simultaneously resetting the parameters s and VSB as 0, steps from ST 4 to ST 12 are recursively implemented (ST 14, ST 16). If the implementation of these steps is finished, outer ECC for three ECC blocks, whose quantity of data is the same as one track main data, is completed. Subsequently, while increasing the value of the parameter t by 1 from 0 to 5 and simultaneously resetting the parameters s, VSB and g as 0, steps from ST 4 to ST 16 are recursively implemented and thereby, the outer ECC of six tracks, that is one frame main data 200, is finished (ST 18, ST 20). The processing order of the outer ECC is tabulated in FIG. 6 for easy comprehension. On calculating the TR and the SB by using equation (1), the parameters (s, g, t) have the changing values (0, 0, 0), (1, 0, 0), . . . , (111, 0, 0), (0, 1, 0), . . . , (111, 2, 0) to shuffle a first ECC block data.

After the completion of the outer ECC for one frame main data, as shown in FIG. 4, ten outer parity sync blocks per ECC block are created, and the 18×10 outer parity sync blocks of one frame are shuffled to be stored at an upper section of each track of the memory 108. A shadow area in FIG. 3 shows the outer parity sync block stored as above.

Figure 7:
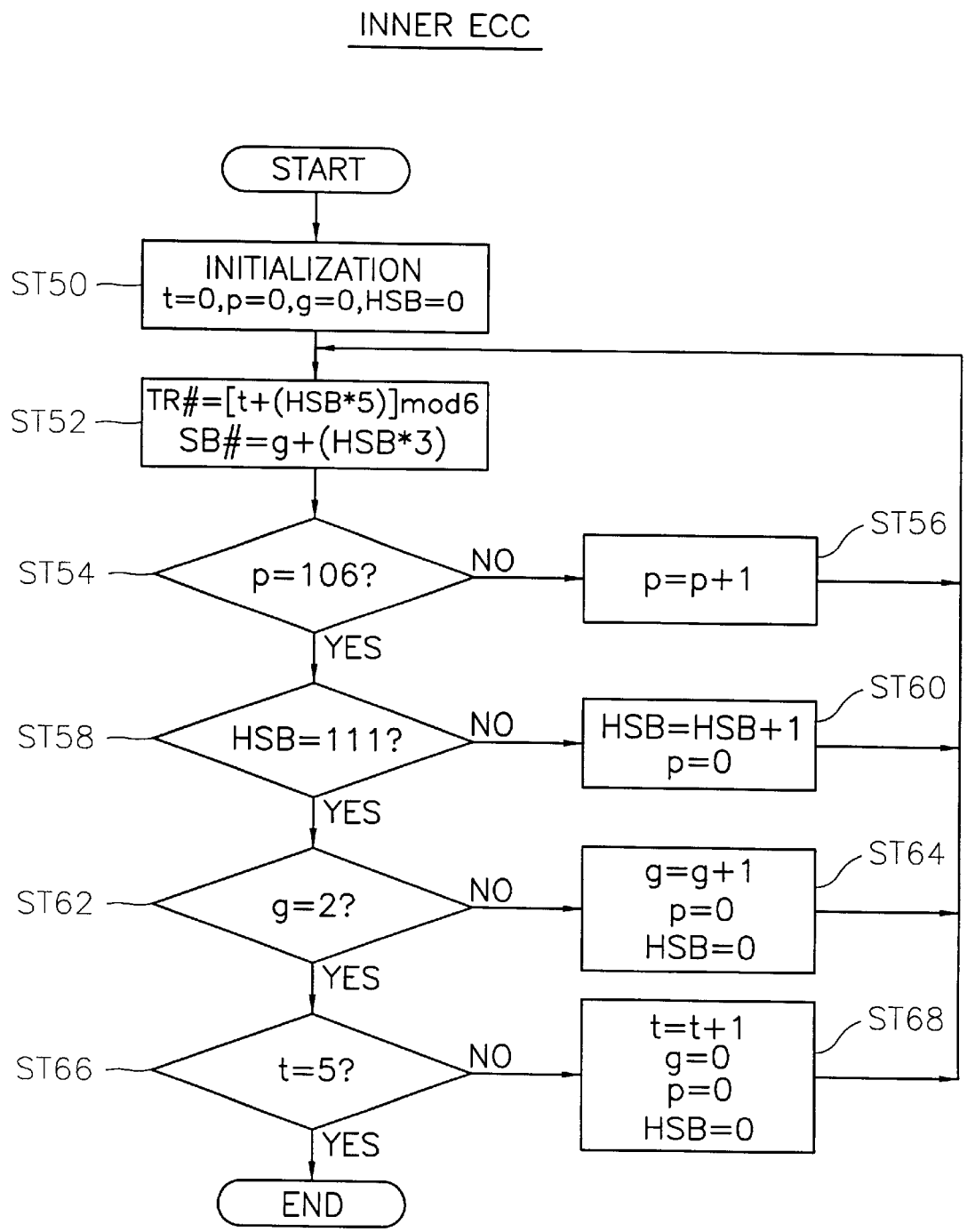
FIG. 7 is a flow chart for explaining a process of inner error correction coding (inner ECC) according to the present invention.

Next, inner ECC should be subsequently carried out for the main data 200 and the outer parity 210. This procedure of the inner ECC is shown in FIG. 7. The inner ECC also follows a similar procedure to that of the outer ECC while using the following equation (2) which is a predetermined shuffling algorithm.

$$TR=[t+(HSB \times 5)] \bmod 6$$

$$SB=g+HSB \times 3 \qquad (2)$$

where there is no change against equation (1) in the meaning and values of the parameters, except that the parameter HSB, an integer between 0 and 111, represents a number for horizontal sync blocks of 1 ECC block consisting of the main data and the outer parity.

To start inner ECC, the parameters t, g, HSB, and P representing byte order within one sync block of the main data and the outer parity are set as 0 for initialization (ST 50).

Next, the shuffler 100 calculates a track number TR and a sync block number SB by using equation (2) (ST 52). The calculated coordinates of tracks and sync blocks (TR, SB) become (0, 0), (5, 3), (4, 6), . . . , (1, 303) as above.

In the first loop, since the coordinate of the calculated tracks and sync blocks (TR, SB) is (0, 0), data of a sync block corresponding to the coordinate are read by the byte from the memory 108 while increasing by 1 the value of the parameter P from 0 to 98 to form a horizontal sync block HSB #0 (ST 54, ST 56).

As for the horizontal sync block HSB #0, eight bytes of an inner parity are produced by a predetermined polynomial for error correction of an intra-sync block. Successively, the track number TR and the sync block number SB are calculated by using equation (2) while increasing the value of the parameter P by 1 from 99 to 106, and then the produced inner parity is stored at a location of the memory 108 corresponding to the calculated coordinate. Here, the calculated coordinate is also (0, 0), as can be seen from equation (2), since the parameter P cannot affect a decision of the track number TR and the sync block number SB.

Successively, while increasing the value of the parameter HSB from 0 to 111 by 1 and resetting the parameter P as 0 at every increment, the steps ST 52 to ST 56 are recursively performed (ST 58, ST 60). If these steps are completed, the inner parity 220 concerning 1 ECC block 200 and 210 is created and stored in the memory 108.

For the remaining 17 sync blocks, the above steps are also repeated. After steps ST 52 to ST 60 are recursively carried out while increasing the value of the parameter g by 1 from 0 to 2 and simultaneously resetting the parameters P and HSB as 0 (ST 62, ST 64), the inner parity for 3 ECC blocks which correspond to a logical 1 track is produced and stored in the memory 108. Subsequently, after steps ST 52 to ST 64 are recursively carried out while increasing the value of the parameter t by 1 from 0 to 5 and simultaneously resetting the parameters P, HSB and g as 0 (ST 66, ST 68), the inner parity for 1 frame is produced and stored in the memory 108. The processing order of this inner ECC is tabulated in FIG. 8. After the finishing of this inner ECC, the main data, the outer parity and the inner parity are stored in the memory 108 in a format as shown in FIG. 3.

Meanwhile, the inner ECC can also be accomplished not by using equation (2), but by sequentially reading in sync blocks of the main data and the outer parity in a storing order thereof to produce inner parity information and by additionally storing the produced inner parity information in a corresponding sync block thereof. This is the second method described above.

In more detail, the sync blocks consisting of the main data and the outer parity within 18 ECC blocks are sequentially read by 1 sync block from a left-lowest sync block (0, 0) to a right-highest sync block (5, 335) from the memory 108 according to the stored order. The RS coder 102, which is supplied with every sync block by the shuffler 100, creates eight bytes of inner parity for error correction by using a predetermined polynomial, and subsequently stores the calculated inner parity in the memory 108 so that the eight bytes of inner parity are added to each corresponding sync block. Until producing of the inner parity for 1 frame data is completed, these above procedures are iteratively implemented.

The third method is described by referring to flow charts shown in FIGS. 5 and 7. It can be known from the flow chart of FIG. 5 that the outer ECC for a single ECC block is accomplished by steps ST 2 to ST 12. It can be also known from the flow chart of the inner ECC in FIG. 7 that the inner ECC for a single ECC block is accomplished by steps ST 50 to ST 60. Accordingly, to accomplish ECC for 1 frame, steps ST 2 to ST 12 and steps ST 50 to ST 60 should be successively repeated 18 times.

Next, decoding methods for reproducing the recorded data on a magnetic tape is explained. As is known, a decoding method depends on an encoding method. Consequently, the above three methods are available for decoding. Here, the meaning of depends is that if a shuffling algorithm is employed for encoding, then the same shuffling algorithm should be applied for decoding. On the contrary, if data are sequentially encoded according to the recorded order without data shuffling, then the data should be sequentially read out for decoding.

In every method, the implementing order of the two kinds of ECCs, that is, the outer ECC and the inner ECC, are exchanged. In the other words, in the case of encoding, the inner ECC follows the outer ECC, but in the case of decoding, the error correcting decoding using the inner parity foregoes the error correcting decoding using the outer parity.

Taking a case following the first method of encoding as an example, an explanation of decoding focusing on differences from the encoding process is given. First, to decode 1 frame data with 18 ECC blocks, every data should be read from the magnetic tape in order to be stored in the memory 108. The deshuffler 110 calculates sync block coordinates by using equation (2), and supplies the data of the calculated sync block to the RS decoder 112 by the byte. The RS decoder 112 corrects errors of the sync block with corresponding inner parity by using a predetermined polynomial. The processing order of sync blocks is identical to the case of encoding, where the coordinates (TR, SB) sequentially become (0, 0), (5, 3), (4, 6), . . . , (1, 303). After finishing these procedures in terms of 18 ECC blocks, another decoding procedure is performed utilizing the outer parity information for the further correction of burst errors which are not amended by the above procedures. At this time, the shuffler 110 shuffles data by using equation (1), and the shuffled data are supplied to the RS decoder 112.

Decoding procedures following the second and the third encoding methods can be sufficiently, analyzed by the above explanation. To only an implement order, in the case of the second method, the decoding for error correction by using the inner parity with respect to 1 ECC block foregoes the decoding by using the outer parity with respect to the same ECC block, and this cycle is repeated 18 times to decode for error correction of 1 frame. In the case of the third method, after the decoding by using the inner parity with respect to all the sync blocks of 6 tracks is sequentially performed, the decoding by using the outer parity is performed by shuffling the 18 ECC blocks.

As described above, the present invention produces the outer parity information by using a predetermined shuffling algorithm, and thereby can conspicuously improve the ability of burst error correction. A simulation by a computer program concerning the present invention shows that within 336 sync blocks multiplied by 6 tracks, that is, 2016 sync blocks, a maximum number of correctable burst errors is 127 sync blocks.

Although the preferred embodiment of the invention has been described, it is understood that the present invention should not be limited to this preferred embodiment, but various changes and modifications can be made by one skilled in the art within the spirit and scope of the invention as hereinafter claimed.

What is claimed is:

1. A method for error correction coding (ECC) by using shuffling of a digital data supplied as a bit stream in a digital-video home system, comprising the steps of:

(A) adding outer parity information to a main data of the digital data by:
  i) storing the main data constituting a frame to which a track number and a sync block number are designated in a storing means, wherein the frame includes 18 ECC blocks and each ECC block includes 102 sync blocks;
  ii) setting values of parameters t, g, s and VSB as 0, wherein the parameters t, g, s, and VSB respectively represent a number for tracks constituting the frame, a number for logical ECC blocks belonging to a track, a number for bytes of data constituting a vertical sync block within the ECC block, and a number for the vertical sync blocks constituting a ECC block;
  iii) calculating a track number TR and a sync block number SB by using equation (1), which is TR=[t+ (s×5)] mod 6 and SB=g+s×3, while increasing a value of the parameter s by 1 from 0 to 101 and forming a vertical sync block by shuffle-reading by the byte the main data from a sync block which corresponds to the calculated track number TR and sync block number SB;
  iv) producing a predetermined byte of the outer parity information for error correction by using a predetermined polynomial with respect to the vertical sync block, and shuffle-writing by the byte the outer parity information at a location of the track number TR and the sync block number SB, which are calculated from the equation (1), in the storing means, while increasing a value of the parameter s by 1 from 102 to 111;
  v) performing recursively substeps iii) and iv) while increasing a value of the parameter VSB by 1 from 0 to 98 and resetting the parameter s as 0 at every increment;
  vi) performing recursively steps iii), iv) and v) while increasing a value of the parameter g by 1 from 0 to 2 and resetting the parameters s and VSB as 0 at every increment; and
  vii) performing recursively the substeps iii), iv), v) and vi) while increasing a value of the parameter t by 1 from 0 to 5 and resetting the parameters s, VSB and g as 0 at every increment, wherein the outer parity information with respect to the main data of one frame is produced by shuffling through substeps i) to vii), and the produced outer parity information is written in the storing means by shuffling; and (B) adding inner parity information to the main data and the outer parity information of the digital data by:
  a) setting values of parameters t, g, P, and HSB as 0, wherein the parameters P and HSB respectively represent a number for bytes of a sync block of the main data and the outer parity information and a number for horizontal sync blocks belonging to the ECC block of the main data and the outer parity information;
  b) calculating a track number TR and a sync block number SB by using equation (2), which is TR=[t+ (HSB×5)] mod 6 and SB=g+HSB×3, while increasing a value of the parameter P by 1 from 0 to 98 and forming a horizontal sync block by reading by the byte the main data and the outer parity information from a sync block which corresponds to the calculated track number TR and sync block number SB;
  c) producing a predetermined byte of the inner parity information for error correction of the horizontal sync block by using a predetermined polynomial, and writing the outer parity information by the byte at a location of the track number TR and the sync block number SB, which are calculated from equation (2), in the storing means, while increasing a value of the parameter P by 1 from 99 to 106;
  d) performing recursively substeps b) and c) while increasing a value of the parameter HSB by 1 from 0 to 111 and resetting the parameter P as 0 at every increment;
  e) performing recursively substeps b), c) and d) while increasing a value of the parameter g by 1 from 0 to 2 and resetting the parameters P and HSB as 0 at every increment; and
  f) performing recursively substeps b), c), d) and e) while increasing a value of the parameter t by 1 from 0 to 5 and resetting the parameters P, HSB and g as 0 at every increment, wherein the inner parity information with respect to the frame of the main data and the outer parity information is produced through substeps a) to f), and the produced inner parity information is written in the storing means.

2. The method as claimed in claim 1, further comprising the step of decoding for error correction by using the outer parity information and the inner parity information after reading out encoded data on a recording medium and storing the encoded data in the storing means, wherein an error correction decoding using the inner parity information is firstly performed for the 18 ECC blocks, an error correction decoding using the outer parity information of the 18 ECC blocks is secondly performed, a data processing order for the error correction decoding by using the inner parity information is the same as a data processing order for producing of the inner parity information, and a data processing order for the error correction decoding by using the outer parity information is the same as a data processing order for producing the outer parity information.

3. A method for error correction coding (ECC) by using shuffling of a digital data supplied as a bit stream in a digital-video home system, comprising the steps of:

(A) adding outer parity information to main data of the digital data by:
  i) storing the main data constituting a frame to which a track number and a sync block number are designated in a storing means, wherein the frame includes 18 ECC blocks and each ECC block includes 102 sync blocks;

ii) setting values of parameters t, g, s and VSB as 0, wherein the parameters t, g, s, and VSB respectively represent a number for tracks constituting the frame, a number for logical ECC blocks belonging to a track, a number for bytes of data constituting a vertical sync block within the ECC block, and a number for the vertical sync blocks constituting a ECC block;

iii) calculating a track number TR and a sync block number SB by using equation (1), which is TR=[t+(s×5)] mod 6 and SB=g+s×3, while increasing a value of the parameter s by 1 from 0 to 101 and forming a vertical sync block by shuffle-reading by the byte the main data from a sync block which corresponds to the calculated track number TR and sync block number SB;

iv) producing a predetermined byte of the outer parity information for error correction by using a predetermined polynomial with respect to the vertical sync block, and shuffle-writing by the byte the outer parity information at a location of the track number TR and the sync block number SB, which are calculated from the equation (1), in the storing means, while increasing a value of the parameter s by 1 from 102 to 111;

v) performing recursively substeps iii) and iv) while increasing a value of the parameter VSB by 1 from 0 to 98 and resetting the parameter s as 0 at every increment;

vi) performing recursively steps iii), iv) and v) while increasing a value of the parameter g by 1 from 0 to 2 and resetting the parameters s and VSB as 0 at every increment; and vii) performing recursively the substeps iii), iv), v) and vi) while increasing a value of the parameter t by 1 from 0 to 5 and resetting the parameters s, VSB and g as 0 at every increment, wherein the outer parity information with respect to the main data of one frame is produced by shuffling through substeps i) to vii), and the produced outer parity information is written in the storing means by shuffling; and (B) adding inner parity information to the main data and the outer parity information of the digital data by:

a) sequentially reading out in a stored order the main data and the outer parity information constituting the 18 ECC blocks by the sync block from the storing means;

b) producing a predetermined byte of the inner parity information for the error correction by using the predetermined polynomial;

c) additionally storing the produced inner parity information at a location of the storing means which corresponds to calculated track number and sync block number; and d) iteratively performing substeps a), b) and c) until the inner parity information for the frame of main data and the outer parity information is completely produced.

4. The method as claimed in claim 3, further comprising the step of decoding for error correction by using the outer parity information and the inner parity information after reading out encoded data on a recording medium and storing the encoded data in the storing means, wherein an error correction decoding using the inner parity information is firstly performed for the 18 ECC blocks, an error correction decoding using the outer parity information of the 18 ECC blocks is secondly performed, a data processing order for the error correction decoding by using the inner parity information is the same as a data processing order for producing of the inner parity information, and a data processing order for the error correction decoding by using the outer parity information is the same as a data processing order for producing the outer parity information.

5. A method for error correction coding (ECC) by using shuffling of a digital data supplied as a bit stream in a digital-video home system, comprising the steps of:

i) storing main data constituting a frame to which a track number and a sync block number are designated in a storing means, wherein the frame includes 18 first stage ECC blocks and a first stage ECC block includes 102 sync blocks;

ii) producing outer parity information of the first ECC block by shuffling, additively storing the produced outer parity information in the first ECC block, and producing a second ECC block further including the outer parity information, said step ii) including the substeps of:

a) setting values of parameters t, g, s and VSB as 0, wherein the parameters t, g, s, and VSB respectively represent a number for tracks constituting the frame, a number for logical ECC blocks belonging to a track, a number for bytes of data constituting a vertical sync block within the ECC block, and a number for the vertical sync blocks constituting a ECC block;

b) calculating a track number TR and a sync block number SB by using equation (1), which is TR=[t+(s×5)] mod 6 and SB=g+s×3, while increasing a value of the parameter s by 1 from 0 to 101 and forming a vertical sync block by shuffle-reading by the byte the main data from a sync block which corresponds to the calculated track number TR and sync block number SB;

c) producing a predetermined byte of outer parity information for error correction by using a predetermined polynomial with respect to the vertical sync block, and shuffle-writing by the byte the outer parity information at a location of the track number TR and the sync block number SB in the storing means, which are calculated from equation (1) while increasing a value of the parameter s by 1 from 102 to 111; and d) performing recursively substeps b) and c) while increasing a value of the parameter VSB by 1 from 0 to 98 and resetting the parameter s as 0 at every increment;

iii) producing inner parity information of a predetermined number of a sync block belonging to the second ECC block, adding the inner parity information to the second ECC block, and thereby producing a third ECC block of the main data including the outer parity information and the inner parity information, said step iii) including the steps of:

e) setting values of the parameters t, g, P and HSB as 0, wherein the parameters P and HSB respectively represent the number of bytes within 1 sync block of the main data and the outer parity information and the number of horizontal sync blocks belonging to 1 ECC block of the main data and the outer parity information;

f) calculating a track number TR and a sync block number SB by using equation (2), which is TR=[t+

(HSB×5)] mod 6 and SB=g+HSB×3, while increasing a value of the parameter P by 1 from 0 to 98 and forming a horizontal sync block by reading by the byte the main data and the outer parity information from a sync block which corresponds to the calculated track number TR and sync block number SB;

g) producing a predetermined byte of inner parity information for error correction by using a predetermined polynomial of the horizontal sync block, and writing the outer parity information by the byte at a location of the track number TR and the sync block number SB, which are calculated from equation (2) in the storing means, while increasing a value of the parameter P by 1 from 99 to 106; and h) performing recursively substeps f) and g) while increasing a value of the parameter HSB by 1 from 0 to 111 and resetting the parameter P as 0 at every increment; and iv) successively performing steps ii) and iii) 18 times to produce outer parity information and inner parity information for the frame main data, which are additionally stored in the storing means.

6. The method as claimed in claim 5, further comprising the step of decoding for error correction by using the outer parity information and the inner parity information after reading out encoded data on a recording medium and storing the encoded data in the storing means, wherein an error correction decoding cycle, where error correction decoding by using the inner parity information is firstly performed for ECC block and an error correction decoding by using the outer parity information of the same ECC block is secondly performed, is iteratively performed 18 times to correct an error of the frame, and wherein a data processing order for the error correction decoding by using the inner parity information is the same as a data processing order for producing the inner parity information and a data processing order for the error correction decoding by using the outer parity information is the same as a data processing order for producing the outer parity information.

* * * * *